(12) United States Patent
Oo et al.

(10) Patent No.: US 7,978,105 B2
(45) Date of Patent: Jul. 12, 2011

(54) CURRENT SENSING AND BACKGROUND CALIBRATION TO MATCH TWO RESISTOR LADDERS

(75) Inventors: Kenneth Thet Zin Oo, Milpitas, CA (US); Pierte Roo, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/684,773

(22) Filed: Jan. 8, 2010

(65) Prior Publication Data
US 2010/0182175 A1    Jul. 22, 2010

Related U.S. Application Data

(60) Provisional application No. 61/145,840, filed on Jan. 20, 2009.

(51) Int. Cl.
*H03M 1/10* (2006.01)
(52) U.S. Cl. .................................. 341/120; 341/155
(58) Field of Classification Search ........... 341/120–155
See application file for complete search history.

(56) References Cited

U.S. PATENT DOCUMENTS

| | | | | |
|---|---|---|---|---|
| 5,471,208 A | * | 11/1995 | Sauer | 341/120 |
| 6,628,216 B2 | * | 9/2003 | Chen et al. | 341/120 |
| 6,956,512 B1 | * | 10/2005 | San et al. | 341/120 |
| 7,046,179 B1 | * | 5/2006 | Taft et al. | 341/120 |
| 7,119,730 B2 | * | 10/2006 | San et al. | 341/163 |
| 7,321,327 B1 | * | 1/2008 | San et al. | 341/144 |
| 7,358,876 B1 | * | 4/2008 | Oo et al. | 341/118 |

* cited by examiner

*Primary Examiner* — Lam T Mai

(57) ABSTRACT

In one embodiment, a first resistor ladder includes a first voltage across the first resistor ladder. A second resistor ladder includes a second voltage across the second resistor ladder. A third resistor ladder includes a third voltage across the third resistor ladder. The calibrator receives the first voltage and third voltage and adjusts a current through the third resistor ladder to adjust the third voltage based on the received first voltage and third voltage. A buffer is configured to provide buffering for the third resistor ladder from the second resistor ladder. The third voltage of the third resistor ladder is stable even though the second voltage of the second resistor ladder is changing.

20 Claims, 9 Drawing Sheets

US 7,978,105 B2

CURRENT SENSING AND BACKGROUND CALIBRATION TO MATCH TWO RESISTOR LADDERS

CROSS REFERENCE TO RELATED APPLICATIONS

The present application claims priority to U.S. Provisional App. No. 61/145,840 for "Analog Digital Conversion Circuitry" filed Jan. 20, 2009, the contents of which is incorporated herein by reference in their entirety.

The present application is related to co-pending U.S. patent application Ser. No. 12/684,735 entitled "Two-Step Subranging ADC Architecture", filed on Jan. 8, 2010, and co-pending U.S. patent application Ser. No. 12/684,760 entitled "Reference Pre-Charging for Two-Step Subranging ADC Architecture", filed on Jan. 8, 2010, the contents of both are incorporated herein in their entirety for all purposes

BACKGROUND

Particular embodiments generally relate to resistor ladders and more specifically to calibration of resistor ladders.

Unless otherwise indicated herein, the approaches described in this section are not prior art to the claims in this application and are not admitted to be prior art by inclusion in this section.

Analog circuit designs require matching of two or more resistor ladders. A user calculates the variations and matching parameters of a given process and also a layout of the physical resistors in a minimum area allowed by the calculation. However, often a large area requirement for the resistor ladders is required especially when matching between several ladders.

It is also difficult to match two ladders with different resistance values especially when the ratio between the two ladders is large. In one example, a unit resistor is created and other resistor ladders are built using different series or parallel combinations of the unit resistor. However, this approach is not area efficient due to the interface and contact portions of the unit resistor.

One way to overcome the above problems is to build one precision master resistor ladder and have the other resistor ladders be imprecise ladders that match the master ladder through calibration. Problems arise in the calibration when the resistor ladders are continuously disturbed by being part of a signal path or by dynamic events. For example, the calibration may be inaccurate when the resistor ladders are disturbed.

FIG. 1 depicts a conventional system 100. System 100 includes a first resistor ladder 102a and a second resistor ladder 102b. First resistor ladder 102a is a master resistor ladder. Second resistor ladder 102b is a slave resistor ladder. The master resistor ladder is a precise ladder and the slave resistance ladder is an imprecise ladder.

Second resistor ladder 102b is matched with first resistor ladder 102a. For example, the voltage across second resistor ladder 102b, $V_B$, is a fixed ratio of the voltage across first resistor ladder 102a, $V_A$.

A calibrator 104 is configured to calibrate the current through second resistor ladder 102b to achieve the desired voltage ratio. Calibrator 104 senses the voltage $V_B$ across second resistor ladder 102b and adjusts the current using a current source 106 such that $V_B$ is adjusted to the fixed ratio with respect to $V_A$. However, when second resistor ladder 102b is part of the signal path or is frequently subject to dynamic events, calibrator 104 has a hard time measuring the voltage of second resistor ladder 102b reliably. The calibration thus becomes inaccurate.

SUMMARY

Particular embodiments provide calibration of resistor ladders. In one embodiment, a first resistor ladder includes a first voltage across the first resistor ladder. A second resistor ladder includes a second voltage across the second resistor ladder. A third resistor ladder includes a third voltage across the third resistor ladder. The calibrator receives the first voltage and third voltage and adjusts a current through the third resistor ladder to adjust the second voltage based on the received first voltage and third voltage. A buffer is configured to provide buffering for the third resistor ladder from the second resistor ladder. The third voltage of the third resistor ladder is stable even though the second voltage of the second resistor ladder is changing.

In one embodiment, an apparatus is provided that comprises: a first resistor ladder including a first voltage across the first resistor ladder; a second resistor ladder including a second voltage across the second resistor ladder; a third resistor ladder including a third voltage across the third resistor ladder; a buffer configured to buffer the third resistor ladder from disturbances in the second resistor ladder; and a calibrator configured to receive the first voltage and the third voltage and adjust a current through the third resistor ladder to adjust the third voltage based on the received first voltage and the received third voltage, wherein the second voltage is calibrated to a voltage ratio with the first voltage by the current adjustment.

In one embodiment, the noise through the second resistor ladder due to an event is attenuated by the buffer.

In one embodiment, the second resistor ladder is in a signal path, wherein the third resistor ladder is buffered from disturbances resulting from the second resistor ladder being in the signal path.

In one embodiment, the buffer comprises a cascode device.

In one embodiment, a method is provided that comprises: receiving a first voltage across a first resistor ladder; receiving a third voltage across a third resistor ladder, wherein the third voltage being received is buffered from disturbances in a second resistor ladder; and adjusting a current through the third resistor ladder to adjust the third voltage to be a first voltage ratio of the first voltage to the third voltage, wherein the adjustment of the current adjusts a second voltage across the second resistor ladder to be a second voltage ratio of the first voltage to the second voltage.

In one embodiment, the current through the second resistor ladder is substantially quiescent.

In one embodiment, the current through the second resistor ladder is buffered from disturbances in the third resistor ladder.

The following detailed description and accompanying drawings provide a better understanding of the nature and advantages of the present invention.

DETAILED DESCRIPTION

Described herein are techniques for calibration of resistor ladders. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

An overview of an ADC architecture that uses the calibration is described first. Then, the calibration of the resistor ladders is described. It will be understood that the calibration may be used in other systems.

Overview of ADC Architecture

Figure 1:
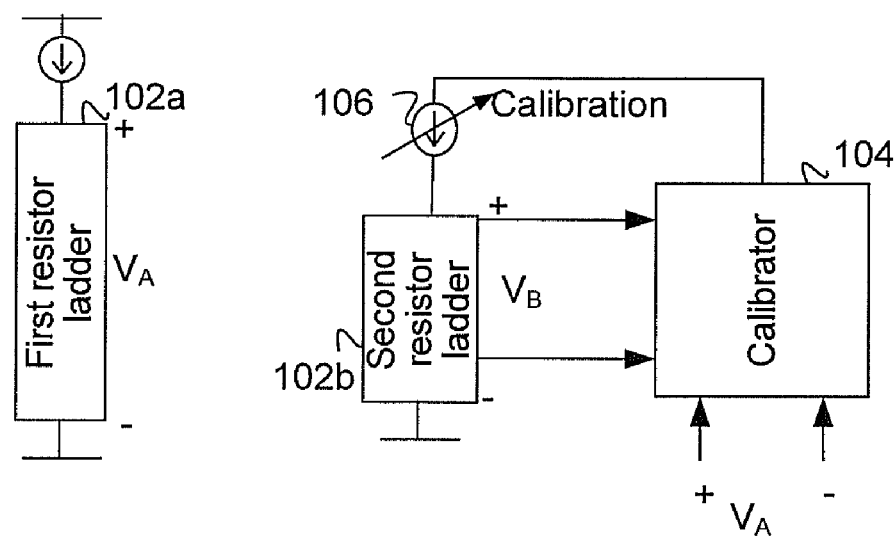
FIG. 1 depicts a conventional system.
Figure 2:
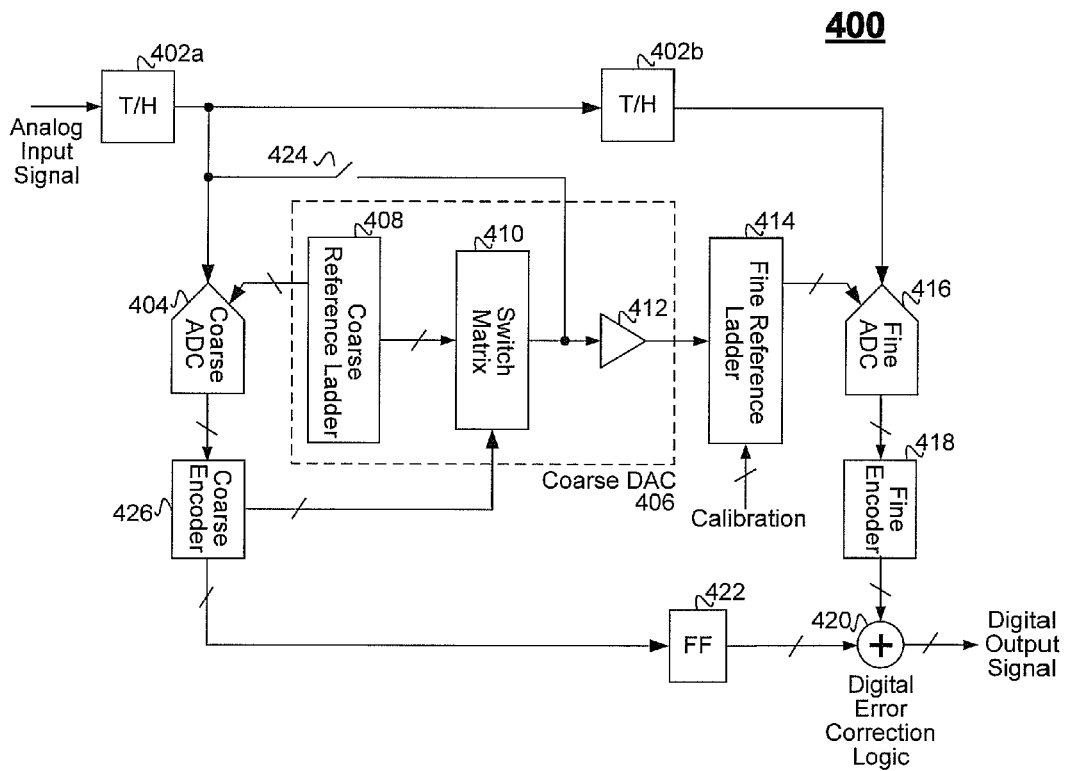
FIG. 2 depicts an analog-to-digital converter architecture according to one embodiment.

FIG. 2 depicts an ADC architecture 400 according to one embodiment. In one embodiment, architecture 400 is used for ultra high-speed, medium-to-high resolution applications. Although these applications are described, architecture 400 may be used in other applications that require an analog-to-digital conversion. In one embodiment, architecture 400 is a two-step subranging ADC architecture.

Architecture 400 converts an analog input signal to a digital output signal. The analog input signal is received at a first track-and-hold stage (T/H) 402a. Track-and-hold stage 402a is configured to track the analog input signal for a part of a clock cycle, T, and store an input voltage for another part of the clock cycle. For example, the analog input signal may be tracked for T/2 and the input voltage is stored for another T/2. The stored input voltage is for a sample of the analog input signal.

A coarse ADC 404 receives the input voltage and performs a comparison of the input voltage to a plurality of coarse references received from a coarse digital-to-analog converter (DAC) 406.

In one embodiment, coarse DAC 406 includes a coarse reference ladder 408, a switch matrix 410, and a buffer 412. Coarse reference ladder 408 is separated from a fine reference ladder 414 through buffer 412. The separation allows for independent optimization of coarse reference ladder 408 and fine reference ladder 414, which will be described in more detail below.

Coarse reference ladder 408 may include a plurality of resistors and a plurality of taps. The plurality of taps provide the plurality of coarse references to coarse ADC 404. The coarse references may be different reference voltage levels.

Figure 3:
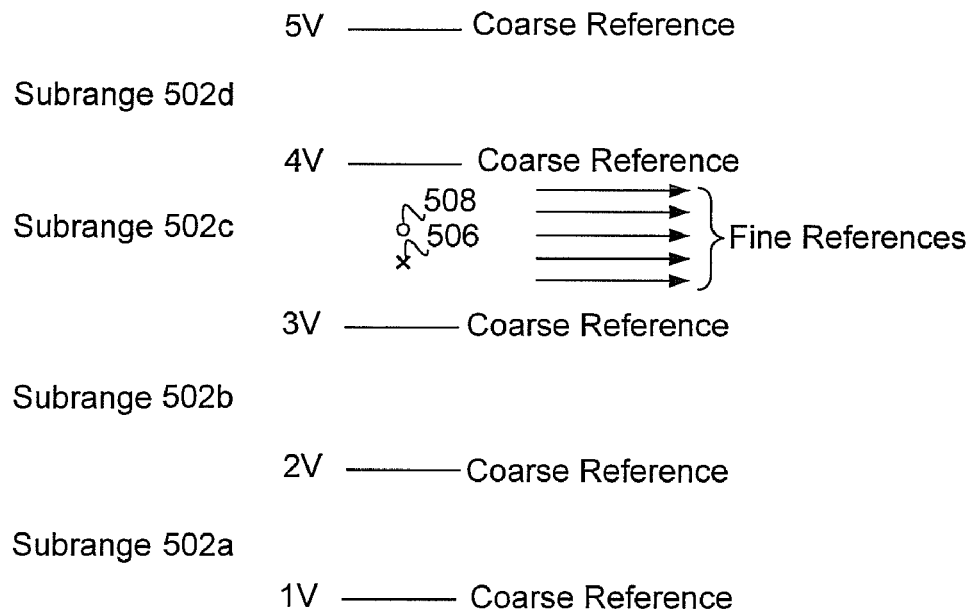
FIG. 3 shows a conceptual example of the subranges according to one embodiment.

Coarse ADC 404 compares the input voltage to the coarse references to determine a coarse decision. The coarse decision may select a coarse reference for a subrange in which the input voltage resides. For example, coarse ADC 404 may choose a midpoint in between a subrange of voltages. FIG. 3 shows a conceptual example of the subranges according to one embodiment. A plurality of subranges 502a-502d are shown and a plurality of coarse references are provided. For example, the coarse references may be 1-5V. Coarse ADC 2-404 compares the input voltage to coarse references and selects which range of values in which the input voltage resides. For example, the input voltage may reside at a point 506 in subrange 502c. Coarse ADC 2-404 then selects subrange 502c. The voltage selected may be a midpoint 508 in subrange 502c. By selecting the midpoint, a slight quantization error, $E_q$ is introduced. As will be explained below, the fine references are used to refine the quantization error using the fine references.

Referring back to FIG. 2, the coarse decision is the result of comparisons between the input voltage and the coarse references. For example, comparators in coarse ADC 404 may compare the input voltage with the different coarse references. Each comparator outputs a logic output based upon the comparison. The value of the logic output is based on whether the coarse reference is higher or lower than the input voltage. For example, a comparator may output a value of 0 if the input voltage has a value that is lower than the coarse reference. Also, a comparator outputs a "1" value if the input voltage has a value higher than the coarse reference. A coarse encoder 414 receives the logic output from the comparators and determines a first digital code. The first digital code is a digital representation of the input voltage.

A switch in switch matrix 410 is closed such that a coarse reference for subrange 3-502 selected by coarse ADC 404 is sent to fine reference ladder 414 through buffer 412. Buffer 412 separates coarse reference ladder 408 from fine reference ladder 414.

The coarse reference is sent to fine reference ladder 414. Fine reference ladder 414 uses the coarse reference to generate a plurality of fine references for a fine ADC 416. The plurality of fine references may be within the subrange selected by coarse ADC 404. For example, referring to FIG. 3, a plurality of fine references are provided in between 3V-4V. A fine reference corresponding to the input voltage is then determined.

Fine ADC 416 receives the plurality of fine references and an input voltage from second track-and-hold stage 402b. For example, second track-and-hold stage 402b tracks the input voltage starting at a T/2 period after the tracking period for first track-and-hold stage 402a and stores the input voltage starting at a T/2 period after the storing period for first track-and-hold stage 402a. By using two track-and-hold stages 402a and 402b, the fine ADC decision may be extended an extra T/2 period. This allows an extended settling time for coarse reference ladder 408 and fine reference ladder 414. This concept will be described in more detail below.

Referring back to FIG. 2, fine ADC 416 compares the fine references to the input voltage. In one embodiment, comparators of fine ADC 416 output logic outputs of comparisons of the fine references and the input voltage. For example, a 0 or 1 may be output depending on the comparison. A comparator may output a value of 0 if the input voltage has a value that is lower than the reference. Also, a comparator outputs a "1" value if the input voltage has a value higher than the reference.

A fine encoder 418 receives the logic outputs of the comparison and determines a second digital code. The second digital code is a digital representation of the input voltage.

Digital error correction logic 420 receives the first digital code from coarse encoder 414 and the second digital code from fine encoder 418. The first digital code may be received through a flip-flop 422. Flip-flop 422 may delay the first digital code because of the decision by fine ADC 416 being delayed by a T/2 period.

Digital error correction logic 420 may include an adder. The adder may add the first digital code and the second digital code to produce a digital output. Additionally, digital error correction logic 420 may weight and error correct the first digital code and the second digital code. In one embodiment, the first digital code may be used to determine the most significant bits (MSB) of the digital output. The second digital code may be used to refine the least significant bits (LSB) of the digital output. The digital output may be a binary code or any other type of code that represents the sample of the analog input in the digital domain.

Coarse reference ladder 408 and the use of additional track and hold stages 402a and 402b in architecture 400 will now be described in more detail. After which, the calibration of fine reference ladder 414 and reference precharging will be described.

Coarse Reference Ladder

Figure 4:
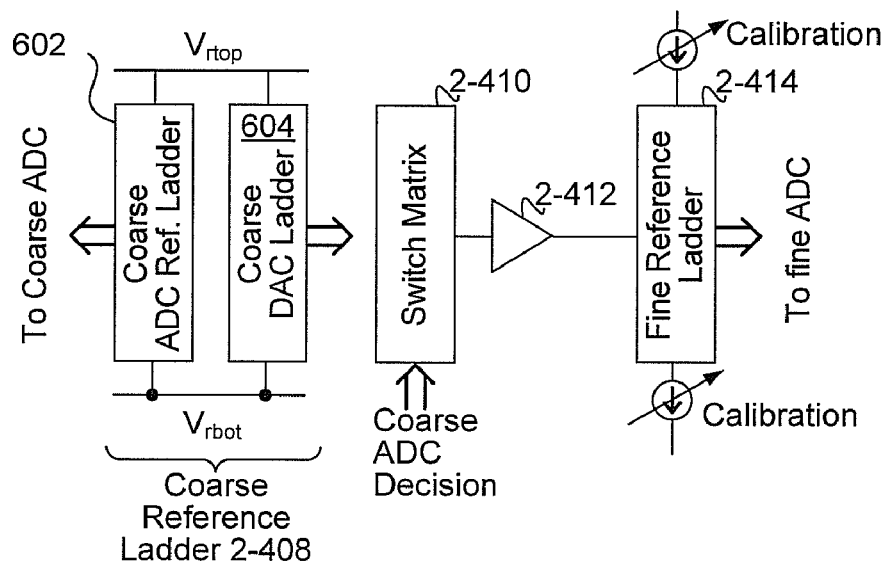
FIG. 4 depicts another example of the subranging ADC reference ladders architecture according to one embodiment.

Particular embodiments provide two reference ladders for coarse reference ladder 408. Although two coarse reference ladders are described, any number of coarse reference ladders may be used. FIG. 4 depicts another example of the subranging ADC reference ladders according to one embodiment. Coarse reference ladder 2-408 includes a coarse ADC reference ladder 602 and a coarse DAC ladder 604. By using two separate ladders, coarse DAC ladder 604 may be free of loading from comparators in coarse ADC 2-404. Additional bandwidth may be gained by coarse DAC ladder 608.

In addition to separating coarse reference ladder 2-408 into coarse ADC reference ladder 602 and coarse DAC ladder 604, fine reference ladder 2-414 is separated from coarse reference ladder 2-408 through buffer 2-412. This allows separate implementation and optimization of coarse ADC reference ladder 602, coarse DAC ladder 604, and fine reference ladder 2-414.

Coarse ADC reference ladder 602 is static. Coarse ADC reference ladder 602 provides a number of reference voltages (e.g., the coarse references) between the voltages $V_{rtop}$ and $V_{rbot}$. The reference voltages provided to coarse ADC 2-404 do not change making coarse ADC reference ladder 602 static.

Coarse DAC ladder 604 is dynamic. Each time coarse ADC 2-404 selects a different subrange, a different coarse reference is provided to fine ADC 2-416. By using two separate ladders, coarse DAC ladder 604 can settle faster from a previous voltage level to the voltage level selected as the subrange. For example, coarse DAC ladder 604 is free of loading from comparators in coarse ADC 2-404, which allows coarse DAC ladder 604 to settle faster. Additionally, coarse DAC ladder 604 may be implemented with a low impedance, high speed design in contrast to coarse ADC reference ladder 602, which may be implemented in a high impedance, slow speed design. Coarse ADC reference ladder 602 is static and may not need to be a high speed design. By using a high impedance design, coarse ADC reference ladder 602 consumes less power. However, the high speed design allows coarse DAC ladder 604 to settle faster to set up the fine references based on the subrange selected by coarse ADC 2-404.

Coarse DAC ladder 604 is also separated from fine reference ladder 2-414 by buffer 2-412. The use of buffer 2-412 instead of coarse DAC ladder 604 to drive fine reference ladder 2-414 prevents a large loading from fine ADC 2-416 on coarse DAC ladder 604. For example, loading from the comparators found in fine ADC 2-416 is prevented. This improves settling speed and slew rate of coarse DAC ladder 604.

Fine reference ladder 2-414 is dynamic because different fine references are being selected based on the subrange selected by coarse ADC 2-404. When different subranges are selected, the fine references are at different voltage levels and this causes shifts in voltage at fine reference ladder 2-414. However, because fine reference ladder 2-414 is separated from coarse DAC ladder 604 by buffer 2-412, coarse DAC ladder 604 is not disturbed by the change in voltage levels at fine reference ladder 2-414.

Fine reference ladder 2-414 may also be floating in that there may not need to be a fixed resistance ratio between fine reference segments and coarse reference segments. A reference segment may be a unit resistor between taps of coarse reference ladder 2-408 or fine reference ladder 2-414. Coarse reference ladder 2-408 or fine reference ladder 2-414 may each include multiple unit resistors that divide the ladder into the different voltage subranges. The unit resistors of floating fine reference segments may be implemented in different orientations and sizes from coarse reference ladder 2-408. Calibration is used to match unit resistors of fine reference ladder 4-414 to coarse reference ladder 4-408, which will be described below. Conventionally, a fixed resistance ratio between coarse reference ladder 2-408 and fine reference ladder 2-414 lead to ultra low resistance segments in a high-speed design if coarse reference ladder 2-408 uses low resistance segments. The very low resistance values may lead to parasitic effects. Also, physical implementation of low resistance segments may require large areas and have other process parasitics (e.g., interface and contacts resistance). Using floating fine references avoids these problems as low impedance resistors may be used but very small resistor segments can be avoided.

Fine reference ladder 2-408 may be floating, but the voltage of fine reference ladder 2-414 is a fixed ratio of the voltage for coarse reference ladder 2-408. A calibration is used to ensure that the voltage ratio is fixed between fine reference ladder 2-414 and coarse reference ladder 2-414. Accordingly, very small resistor segments that are used in coarse DAC ladder 604 do not need to be used in fine reference ladder 2-414. More details of the calibration of fine reference ladder 2-414 will be described below.

Figure 5:
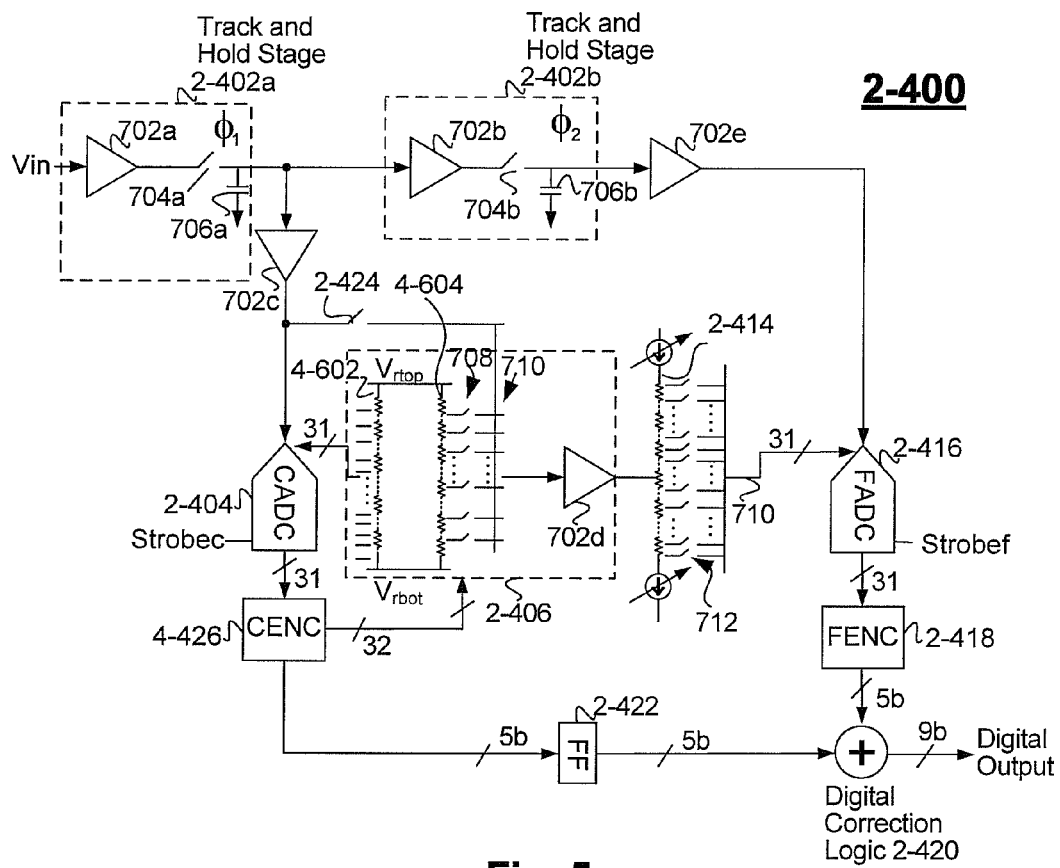
FIG. 5 depicts a more detailed example of the ADC architecture according to one embodiment.

Example Implementation of ADC Architecture Using Multiple Track and Hold Stages FIG. 5 depicts a more detailed example of ADC architecture 2-400 according to one embodiment. A first track-and-hold stage 2-402a includes an amplifier 702a, a switch 704a, and a capacitor 706a. Although this implementation of track-and-hold stage 2-402a is described, other implementations may be appreciated. Capacitor 706a is used to store the input voltage. Switch 704a is toggled between the track stage and the hold stage. The switch may be closed to charge capacitor 706a and then opened when the voltage is stored.

A second track-and-hold stage includes an amplifier 702b, switch 704b, and capacitor 706b. Amplifier 702b is gain matched with amplifier 702c. The matching ensures that the input voltage that is being input into coarse ADC 2-404 is matched with the voltage being tracked and stored by track-and-hold stage 2-402b.

Coarse DAC 2-406 includes coarse ADC reference ladder 4-602 and coarse DAC ladder 4-604. Coarse DAC 4-406 and coarse DAC ladder 6-604 each include a plurality of unit resistors. 31 coarse taps of coarse ADC reference ladder 6-602 in between the unit resistors are provided to coarse ADC 4-404. However, any number of coarse taps may be used. In this case, architecture 400 may be a 7-bit resolution ADC.

Coarse ADC (CADC) 2-404 receives a clocking signal, strobec. At each clock cycle, coarse ADC 2-404 makes a coarse decision. For example, when a coarse reference is selected by coarse ADC 2-404, coarse encoder (CENC) 2-426 provides a control signal to switches 708 included in switch matrix 2-410 to close one of the switches corresponding to the coarse reference selected. In one embodiment, a 32-bit signal is sent to open or close switches 708.

The selected coarse reference is sent through a buffer 702*d* from coarse DAC ladder 6-604. A buffer 702*e* is gain matched with buffer 702*d*. This ensures that the input voltage into fine ADC 2-416 from buffer 702*e* is gain matched with the reference selected by coarse ADC 2-404.

A plurality of fine taps and a plurality of fine switches 712 are included in fine reference ladder 2-414. In one example, based on the signal received, different switches in fine reference ladder 2-414 are closed to send 31 fine references to fine ADC 2-416. Fine ADC 2-416 may also receive the input voltage from buffer 702*e*.

Fine ADC (FADC) 2-416 makes a fine decision at each clock cycle of a clocking signal, strobef. For example, fine ADC 2-416 outputs logic outputs from comparisons of the input voltage and the fine references. Fine encoder 2-418 uses the logic outputs to determine a second digital code. Digital correction logic 2-420 receives the second digital code and the first digital code through a flip-flop 2-422. The first digital code may be used to determine the 5 most significant bits for the digital output and the second digital code may be used to refine the 5 least significant bits of the first digital code. For example, digital correction logic 420 combines and error corrects the first digital code and second digital code into a 7-bit digital output.

Figure 6:
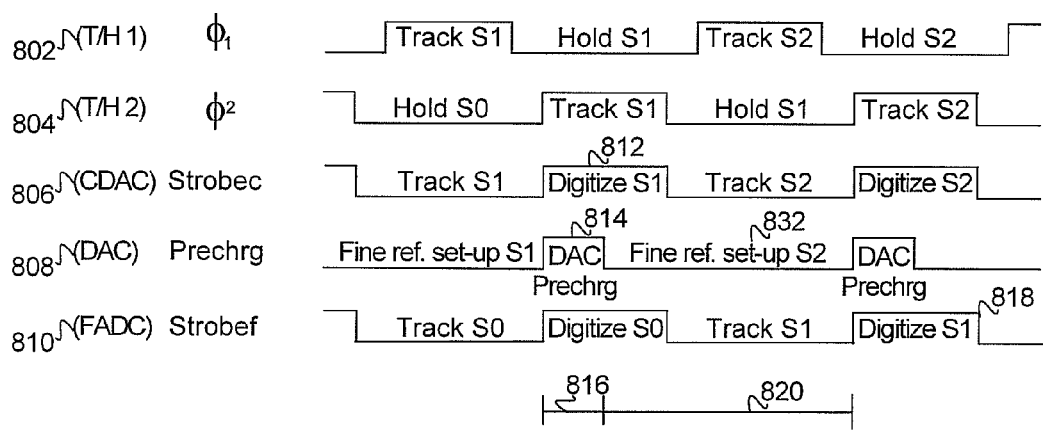
FIG. 6 depicts a timing diagram for the ADC architecture described in FIG. 5 according to one embodiment.

FIG. 6 depicts a timing diagram for architecture 2-400 described in FIG. 5 according to one embodiment. Because two track-and-hold stages 2-404*a* and 2-404*b* are used, additional time for reference settling is provided. Conventionally, the coarse decision, fine reference bit encoding, and fine reference settling are all are done in half of a clock cycle T/2. However, in particular embodiments, this total time is extended by another half clock period ~T/2 to be approximately a full clock period before fine ADC 2-416 needs to start making a comparison.

At 802 and 804, the signals for first track-and-hold stage 2-404*a* and second track-and-hold stage 2-402*b* are shown. First track-and-hold stage 2-404*a* tracks and holds a sample for a clock period, T, and then second track-and-hold stage 2-402*b* tracks and holds the same sample for another clock period, T. For example, first track-and-hold stage 2-402*a* tracks and holds a new sample S1 and then second track-and-hold stage 2-402*b* tracks and holds the new sample. While first track and hold stage 2-402*a* is tracking the new sample S1, second track and hold stage 2-402*b* is holding a current sample S0. The delay in tracking and holding between first track-and-hold stage 2-402*a* and second track-and-hold stage 2-402*b* is approximately T/2.

At 806, 808, and 810, the signals for coarse ADC 2-404, coarse DAC 2-406, and fine ADC 2-416 are shown, respectively. Coarse ADC 2-404 makes a coarse decision at 812 for the sample S1. The fine references need to be set up after the coarse decision is made. That is, coarse DAC reference ladder 4-604 settles. Additionally, a precharge of the output of coarse DAC ladder 4-604 is performed at 814. A time period shown at 816 shows the time taken to make the coarse decision.

Fine ADC 2-416 then makes a fine decision for the sample S1 at 818. Thus, instead of determining the first digital code and the second digital code, respectively, within consecutive T/2 periods, the fine decision time is extended to another T/2 period. That is, the coarse decision determination starts in a first T/2 period, a second T/2 period passes, and the fine decision determination is started after the second T/2 period. As shown at 820, fine reference ladder 2-414 settles and makes the fine decision in a second time period. Fine ADC 2-416 has approximately a full clock period before fine ADC 2-416 has to start a comparison to determine the fine decision after the coarse decision determination starts. This allows the ADC conversion rate to be higher.

Architecture 2-400 is described in co-pending U.S. patent application Ser. No. 12/684,735 entitled "Two-Step Subranging ADC Architecture", filed concurrently, the contents of which is incorporated herein in its entirety for all purposes.

Calibration of Fine Reference Ladder

Figure 7:
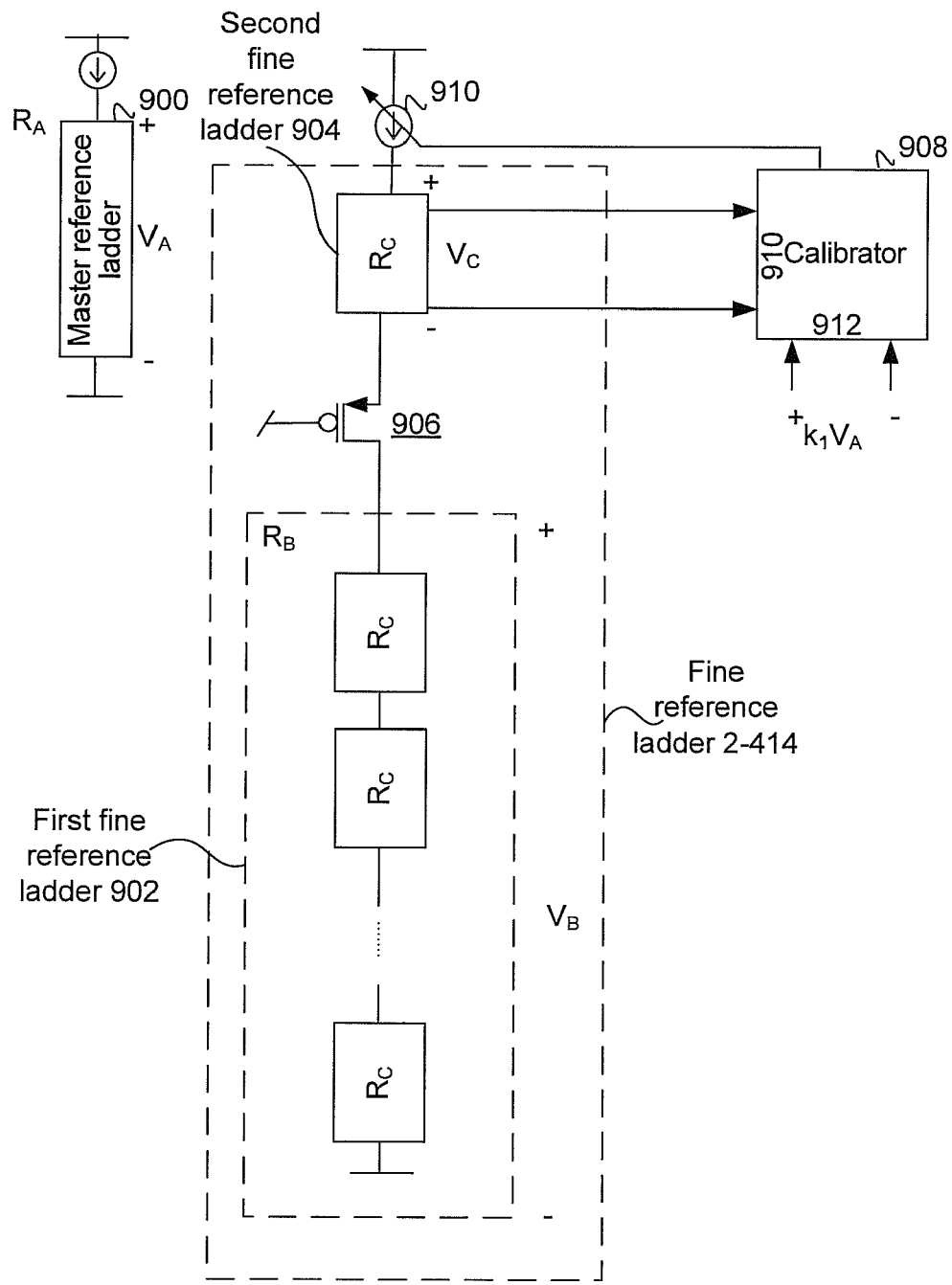
FIG. 7 depicts an example of calibration of reference ladders according to one embodiment.

FIG. 7 depicts an example of calibration of reference ladders according to one embodiment. The calibration is described with respect to coarse reference ladder 2-408 and fine reference ladder 2-414; however, it will be understood that the calibration described herein may be used with respect to other designs. For example, other designs that require multiple reference ladders may use the calibration described. Also, although reference ladders that provide references are discussed, the calibration may be used on any resistor ladders.

In one embodiment, a master reference ladder 900 is part of coarse reference ladder 2-408. For example, master reference ladder may be a reference segment (unit resistor) that is selected as the subrange by coarse ADC 2-404. Master reference ladder 900 is a precise ladder. For example, master reference ladder 900 is built using larger valued unit resistors, $R_A$, where a voltage, $V_A$, is stable across the unit resistor $R_A$.

Fine reference ladder 2-414 includes a first fine reference ladder 902 and a second fine reference ladder 904. Second fine reference ladder 904 may be a separate part of or included in fine reference ladder 2-414. Second fine reference ladder 904 includes a unit resistor, $R_C$, and first fine reference ladder 902 includes a unit resistor, $R_B$. Unit resistor $R_B$ includes one or more unit resistors $R_C$.

Second fine reference ladder 904 is separated from first fine reference ladder 902 using a buffer component 906. For example, buffer component 906 may be one or more cascode devices. Buffer 906 attenuates noise from a signal path that is from coarse reference ladder 2-408 to first fine reference ladder 902. Because first fine reference ladder 902 is in the signal path, it may produce noise. Buffer 906 provides a high-impedance shielding from the signal path that may filter or attenuate the noise from first fine reference ladder 902.

Dynamic events occur at first fine reference ladder 902 that may cause the noise. For example, the voltage $V_B$ may be dynamically changing. In one example, as different subranges are selected in fine reference ladder 2-414, different voltage levels are across first fine reference ladder 902. In contrast, the voltage $V_C$ is not changing and second reference ladder 904 is quiet compared to first reference ladder 902. Because of the shielding from buffer 906, the current through second fine reference ladder 904 is also almost quiescent and is isolated from dynamic events at first fine reference ladder 902 because any noise from the events is absorbed by buffer 906.

A calibrator 908 performs a calibration of voltages across second fine reference ladder 904 and master reference ladder 900. The quiet voltage across second fine reference ladder 904 can also be used to calibrate the voltage across first fine reference ladder 902. Using a quiet voltage instead of a noisy voltage provides a more accurate calibration. In one embodiment, calibrator 908 uses a low-offset, low speed calibration loop in the background to perform the calibration.

Calibrator 908 senses the voltage $V_C$ from second fine reference ladder 904 at a sense port 910. Also, calibrator 908 senses the voltage across the whole or a segment of first reference ladder 2-408 at a reference port 912. The voltage $V_A$ is a multiple $k_1$ of $V_C$, where $k_1$ is a constant. Calibrator 908 adjusts the current to adjust $V_C$ to be multiple $k_1$ of $V_A$. For example, the current may be adjusted using a current source 910.

First fine reference ladder 902 and second fine reference ladder 904 are matched together using a fixed ratio. For example, first reference ladder 902 is built using units of second fine reference ladder 904, or vice versa. If a unit resistor, $R_C$, is used in second fine reference ladder 904, first fine reference ladder 902 is built using multiple unit resistors of $R_C$.

By using multiple units of $R_C$, the voltage $V_B$ may be a fixed ratio of $V_A$. For example, the voltage $V_C$ is:

$$V_C = k_1 V_A$$

If first fine reference ladder 902 and second fine reference ladder 904 having good matching, then:

$$V_B = k_2 V_C = k_2 k_1 V_A = k_3 V_A$$

Thus, $V_B$ is a fixed ratio of $V_A$, where $k_1$, $k_2$, and $k_3$ are constants.

Accordingly, first fine reference ladder 902 may be matched to coarse reference ladder 2-408 through the calibration. First fine reference ladder 902 and second fine reference ladder 904 may be implemented using different orientation and size resistors from coarse reference ladder 2-408. Also, matching is kept over all corners and long term drifts using background calibration without disturbing the signal path or having calibration affected by the signal path.

Figure 8:
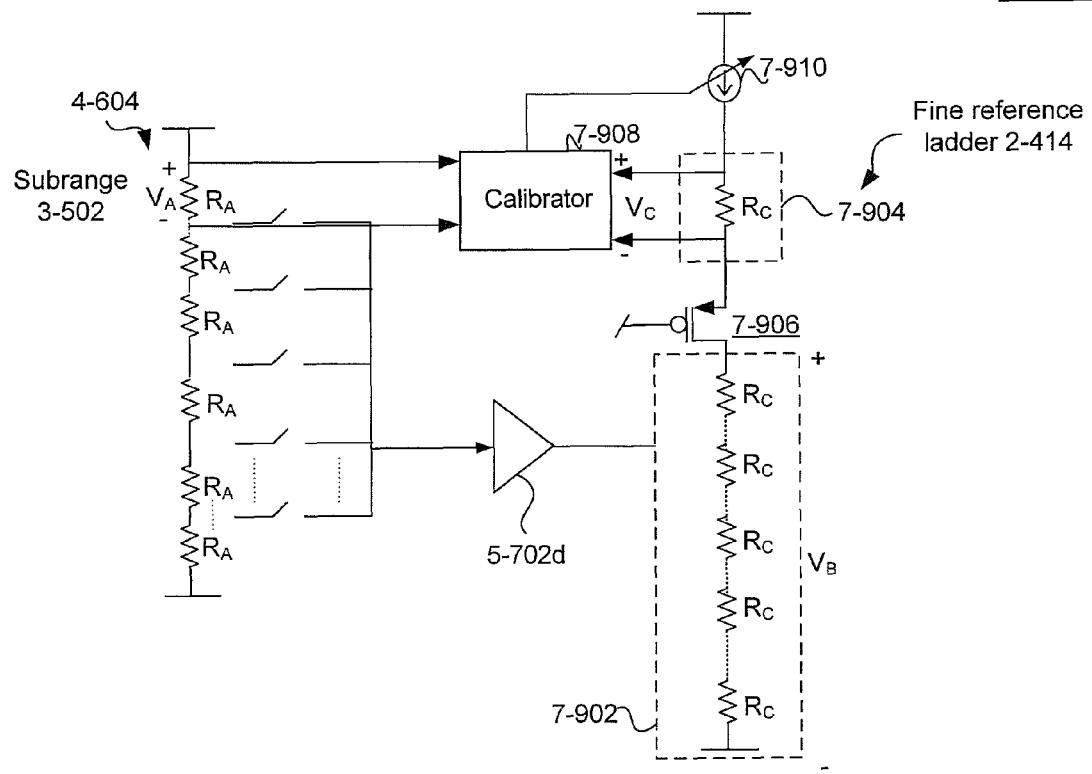
FIG. 8 shows a more detailed example of the ADC architecture according to one embodiment.

FIG. 8 shows a more detailed example of architecture 2-400 according to one embodiment. As shown, coarse DAC ladder 4-604 includes a plurality of unit resistors $R_A$. Second fine reference ladder 7-904 includes a unit resistor $R_C$ and first fine reference ladder 7-902 includes a plurality of unit resistors $R_C$. As discussed above, coarse ADC 2-404 receives an input voltage and selects a coarse reference. A subrange 3-502 in coarse DAC ladder 4-604 is selected to send the coarse reference to fine reference ladder 2-414 through buffer 5-702d. Buffer component 7-906 is coupled to a circuit such that it attenuates noise from first fine reference ladder 9-902. A current based on a voltage level of the coarse reference is sent to buffer 7-702. The voltage $V_A$ is a voltage drop across a unit resistor of coarse DAC ladder 6-604. The voltage $V_B$ is matched to a fixed ratio of the selected voltage $V_A$ using the calibration.

The voltage $V_A$ is sent to calibrator 7-908. Calibrator 7-908 also senses the voltage $V_C$ across second fine reference ladder 7-904. Calibrator 7-908 calibrates the current across fine reference ladder 2-414 using current source 7-910. As discussed above, the voltage $V_B$ is calibrated to a multiple $V_A$.

Figure 9:
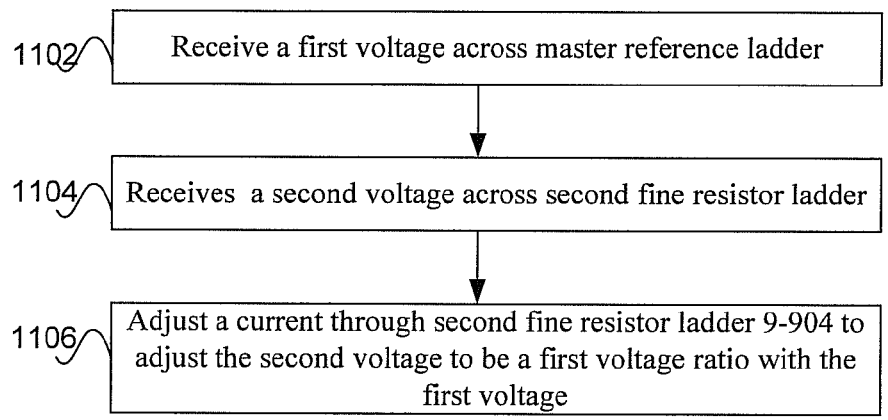
FIG. 9 depicts a simplified flowchart of a method for calibrating reference ladders according to one embodiment.

FIG. 9 depicts a simplified flowchart 1100 of a method for calibrating reference ladders according to one embodiment. At 1102, calibrator 7-908 receives a first voltage across master reference ladder 7-900. At 1104, calibrator 7-908 receives a second voltage across second fine reference ladder 7-904. The second voltage being received is buffered from disturbances in a third reference ladder.

At 1106, calibrator 7-908 adjusts a current through second fine reference ladder 7-904 to adjust the second voltage to be a first voltage ratio with the first voltage. The adjustment of the current adjusts a third voltage across first fine reference ladder 7-902 to be a second voltage ratio of the first voltage to the third voltage.

Reference Precharge

Referring back to FIG. 2, in one embodiment, a pre-charge of the voltage level at the output of switch matrix 410 is provided. The voltage level is pre-charged to a level of the input voltage. This allows the movement of the voltage at the output of switch matrix 410 to be performed more quickly. For example, the previous voltage level at the output of switch matrix 410 may be the voltage of the last analog input sample. The voltage level needs to be moved from the previous voltage level to the coarse reference selected by coarse ADC 404. For example, the coarse reference selected by coarse ADC 404 is the input voltage plus a quantization error $E_q$. The quantization error $E_q$ is the error from the closest digital code that approximates the input voltage.

A time period is taken where coarse ADC 404 is making the coarse decision. During this time period, the voltage level at the output of switch matrix 410 may be pre-charged to the input voltage ($V_{in}$). When the coarse decision is made, the voltage only needs to be changed to $V_{in}+E_q$. For example, the selected coarse reference is a voltage that is for a subrange that includes input voltage. Thus, if it is known the output of switch matrix 410 will be around $V_{in}+E_q$, the output of switch matrix 410 may be pre-charged to the input voltage V. The adjusting of the input voltage $V_{in}$ may be performed faster because adjusting an $E_q$ amount is a much smaller adjustment than from the previous sample's voltage level.

As shown in FIG. 4, a switch 424 is provided to allow the precharge of the output of switch matrix 4-410. Switch 424 may be closed to precharge the output of switch matrix 410 while coarse ADC 404 is making the coarse decision. When the coarse decision is made, switch 424 is opened to allow the output of switch matrix 410 to settle to $V_{in}+E_q$. In this case, a switch in switch matrix 410 is closed and the coarse reference is sent to buffer 4-412.

FIG. 5 also shows the precharge according to one embodiment. As shown, switch 2-424 is used to precharge output lines of coarse DAC 4-604. When coarse ADC is making the coarse decision, switch 2-424 may be closed and switches 708 may be open. This allows input lines 710 to be precharged to the input voltage $V_{in}$. In one embodiment, all input lines 710 are precharged. Thus, when the coarse reference is selected, the selected input line 710 is precharged. When the coarse decision is made, a switch 708 is closed to send the coarse reference to fine reference ladder 2-414. Also, switch 2-424 is opened to allow the selected input line 710 to settle to $V_{in}+E_q$.

Figure 10:
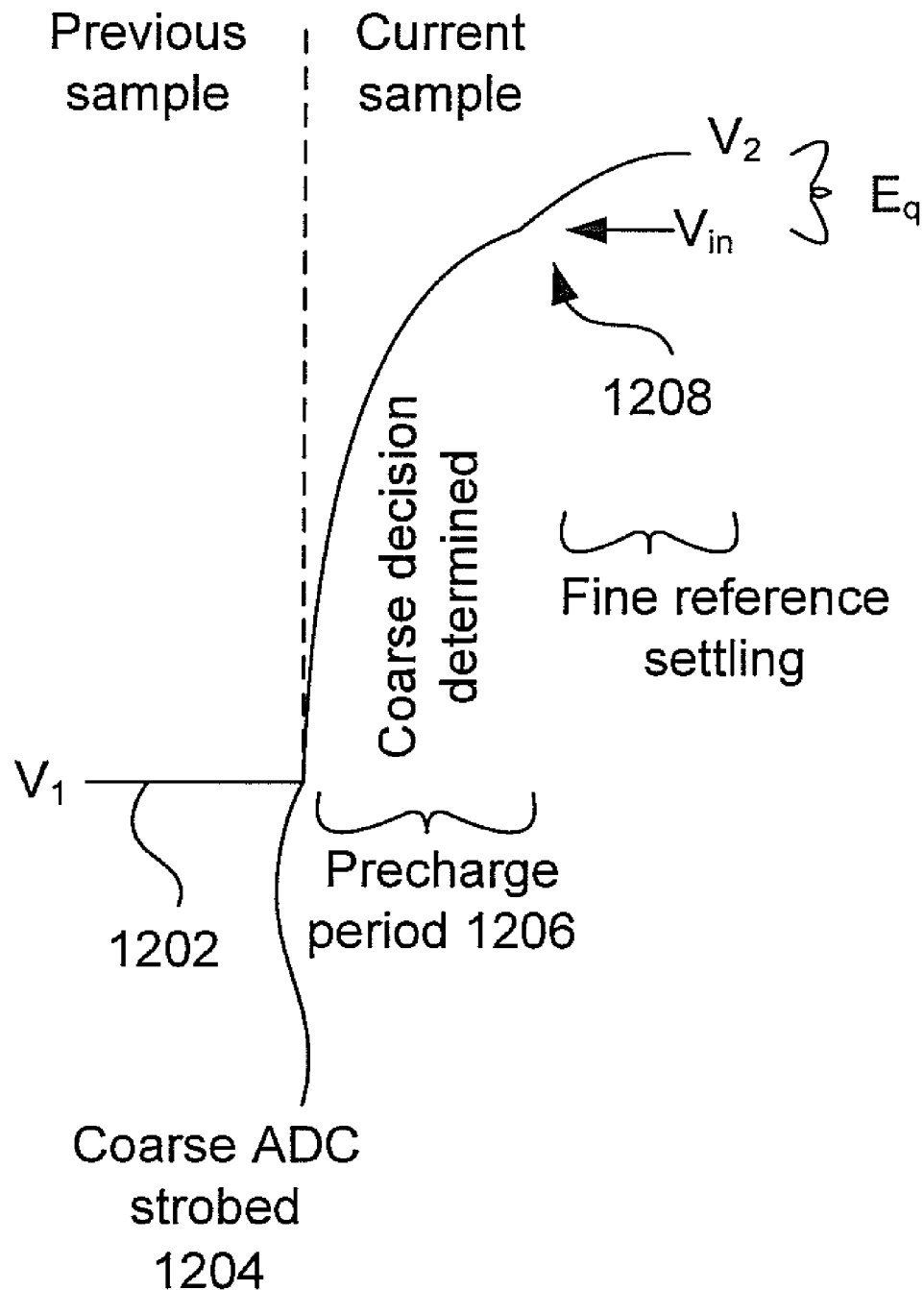
FIG. 10 depicts a waveform showing the pre-charge of an output of a switch matrix according to one embodiment.

FIG. 10 depicts a waveform showing the pre-charge of an output of switch matrix 2-410 according to one embodiment. At 1202, the voltage at the output of switch matrix 2-410 is $V_1$. This is the voltage of the previous input voltage sample. At 1204, coarse ADC 2-404 is strobed. At this point, coarse ADC 2-404 may start to make a coarse decision. For example, at 1206, coarse ADC 2-404 performs a comparison of the input voltage and the plurality of coarse references. At 1208, the first digital code is determined based on the comparison. The first digital code is used to select a switch in switch matrix 2-410.

The output of switch matrix 2-410 is pre-charged during a period at 1206. When a switch is selected, instead of the voltage at the output of switch matrix 2-410 being at $V_1$, the voltage is substantially around $V_{in}$. The voltage then needs to settle at the coarse reference of the input voltage $V_{in}$ plus the coarse quantization error $E_q$.

The use of the pre-charge is described in more detail in co-pending U.S. patent application Ser. No. 12/684,760 entitled "Reference Pre-Charging for Two-Step Subranging ADC Architecture", filed on Jan. 8, 2010, the contents of which is incorporated herein in its entirety for all purposes.

Method Using Particular Embodiments

Figure 11:
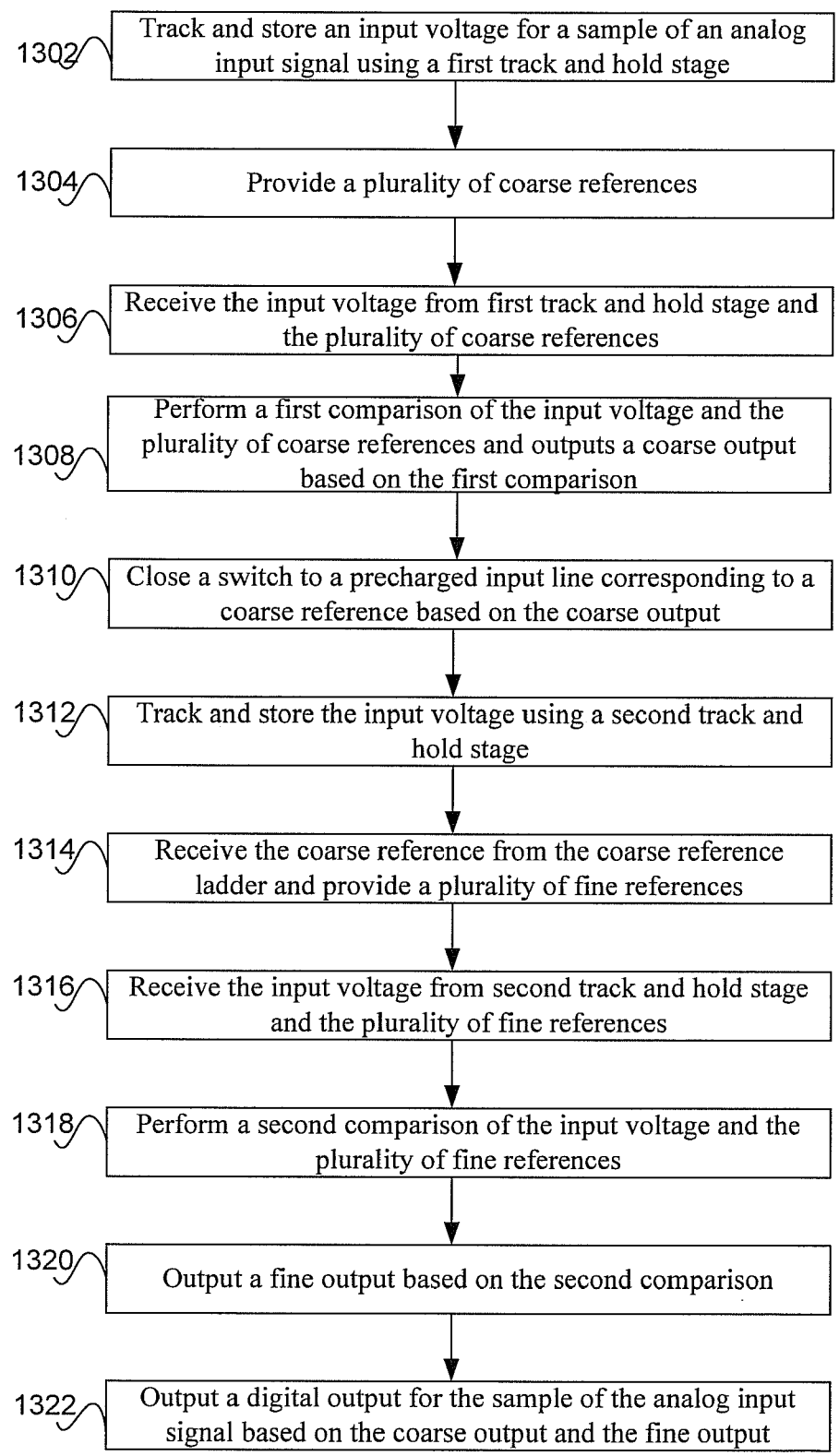
FIG. 11 depicts a simplified flowchart of a method for converting an analog input signal to a digital output signal according to one embodiment.

FIG. 11 depicts a simplified flowchart 1300 of a method for converting an analog input signal to a digital output signal according to one embodiment. At 1302, first track and hold stage 2-402a tracks and stores an input voltage for a sample of an analog input signal. At 1304, coarse reference ladder 2-408 provides a plurality of coarse references. In one embodiment, coarse reference ladder 2-408 includes first coarse ADC reference ladder 4-602 and second coarse reference ladder 4-604.

At 1306, coarse ADC 2-404 receives the input voltage from first track and hold stage 2-402a and the plurality of coarse references. At 1308, coarse ADC 2-404 performs a first comparison of the input voltage and the plurality of coarse references and outputs a coarse output based on the first comparison. At 1310, switch matrix 2-410 closes a switch corresponding to a coarse reference based on the coarse output. An input line has been precharged to the input voltage.

At 1312, second track and hold stage 402b tracks and stores the input voltage. At 1314, fine reference ladder 2-414 receives the coarse reference from the coarse reference ladder and provides a plurality of fine references. The plurality of fine references are determined based on the coarse reference. At 1316, fine ADC 2-416 receives the input voltage from second track and hold stage 2-402b and the plurality of fine references. At 1318, fine ADC 2-416 performs a second comparison of the input voltage and the plurality of fine references. At 1320, fine ADC 2-416 outputs a fine output based on the second comparison. At 1322, a digital output is output for the sample of the analog input signal based on the coarse output and the fine output.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
    a first resistor ladder including a first voltage across the first resistor ladder;
    a second resistor ladder including a second voltage across the second resistor ladder;
    a third resistor ladder including a third voltage across the third resistor ladder;
    a buffer configured to buffer the third resistor ladder from disturbances in the second resistor ladder; and
    a calibrator configured to receive the first voltage and the third voltage and adjust a current through the third resistor ladder to adjust the third voltage based on the received first voltage and the received third voltage, wherein the second voltage is calibrated to a voltage ratio with the first voltage by the current adjustment.

2. The apparatus of claim 1, wherein the voltage ratio comprises a first voltage ratio, the apparatus further comprising a second voltage ratio, the second voltage ratio between the first voltage and the third voltage is used to determine the current adjustment to maintain the first voltage ratio between the first voltage and the second voltage.

3. The apparatus of claim 1, wherein the current through the third resistor ladder is substantially quiescent.

4. The apparatus of claim 3, wherein noise through the second resistor ladder due to an event is attenuated by the buffer.

5. The apparatus of claim 3, wherein the second resistor ladder is in a signal path, wherein the third resistor ladder is buffered from disturbances resulting from the second resistor ladder being in the signal path.

6. The apparatus of claim 1, wherein the buffer comprises a cascode device.

7. The apparatus of claim 1, wherein the third resistor ladder comprises a unit resistor, wherein the second resistor ladder includes a plurality of the unit resistors.

8. The apparatus of claim 7, wherein the voltage ratio is based on a number of the plurality of unit resistors in the second resistor ladder to the unit resistor in the third resistor ladder.

9. The apparatus of claim 1, wherein the second resistor ladder and the third resistor ladder include a plurality of resistors with a smaller impedance from a plurality of resistors in the first resistor ladder.

10. The apparatus of claim 1, wherein the second resistor ladder and the third resistor ladder are part of a same resistor ladder.

11. The apparatus of claim 1, wherein the calibrator comprises a first port to sense the third voltage and a second port to sense the first voltage.

12. The apparatus of claim 1, wherein the first resistor ladder is configured to provide a plurality of coarse references, the apparatus further comprising:
    a coarse analog-to-digital converter (ADC) configured to receive an input voltage and the plurality of coarse references from the first resistor ladder, the coarse ADC configured to perform a first comparison of the input voltage and the plurality of coarse references and output a coarse output based on the first comparison;
    a switch matrix including a plurality of switches, the switch matrix configured to close a switch corresponding to a coarse reference determined based on the coarse output, wherein the first resistor ladder includes a coarse unit resistor corresponding to the coarse reference, the coarse unit resistor including the first voltage across the coarse unit resistor;
    a fine reference ladder configured to receive the coarse reference from the coarse resistor ladder, wherein the fine reference ladder comprises the second resistor ladder and the third resistor ladder, wherein the second resistor ladder is configured to provide a plurality of fine references determined based on the coarse reference;

a fine ADC configured to receive the input voltage and the plurality of fine references, wherein the fine ADC is configured perform a second comparison of the input voltage and the plurality of fine references and output a fine output based on the second comparison; and logic configured to output a digital output for a sample of the analog input signal based on the coarse output and the fine output.

13. The apparatus of claim 12, wherein the first resistor ladder comprises a plurality of unit resistors associated with the plurality of coarse references.

14. The apparatus of claim 13, wherein the first voltage is a voltage across a unit resistor of the plurality of unit resistors.

15. The apparatus of claim 12, wherein the first resistor ladder comprises:

a first coarse resistor ladder; and a second coarse resistor ladder, wherein the second coarse resistor ladder is a precise resistor ladder.

16. That apparatus of claim 15, wherein the second resistor ladder and the third resistor ladder are imprecise resistor ladders requiring the calibration.

17. The apparatus of claim 12, wherein the second resistor ladder is in a signal path from the first resistor ladder to the fine ADC, wherein the buffer buffers the third resistor ladder from disturbances in the signal path.

18. A method comprising:

receiving a first voltage across a first resistor ladder;

receiving a third voltage across a third resistor ladder, wherein the third voltage being received is buffered from disturbances in a second resistor ladder; and adjusting a current through the third resistor ladder to adjust the third voltage to be a first voltage ratio of the first voltage to the third voltage, wherein the adjustment of the current adjusts a second voltage across the second resistor ladder to be a second voltage ratio of the first voltage to the second voltage.

19. The method of claim 18, wherein the current through the third resistor ladder is substantially quiescent.

20. The method of claim 18, wherein the current through the third resistor ladder is buffered from disturbances in the second resistor ladder.

* * * * *